(12) United States Patent
Nakao et al.

(10) Patent No.: US 6,603,371 B2
(45) Date of Patent: Aug. 5, 2003

(54) SURFACE ACOUSTIC WAVE DEVICE HAVING A SMALL ACOUSTIC VELOCITY DISTRIBUTION AND METHOD OF PRODUCING THE SAME

(75) Inventors: Takeshi Nakao, Nagaokakyo (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/950,419

(22) Filed: Sep. 12, 2001

(65) Prior Publication Data
US 2002/0060618 A1 May 23, 2002

(30) Foreign Application Priority Data
Sep. 20, 2000 (JP) .................... 2000-285771
Aug. 23, 2001 (JP) .................... 2001-253065

(51) Int. Cl.$^7$ ............................... H03H 9/64
(52) U.S. Cl. .............. 333/193; 333/195; 310/313 D; 310/363; 29/25.35
(58) Field of Search ............. 333/193–196; 310/313 R, 313 B, 313 C, 313 D, 363; 29/25.35

(56) References Cited

U.S. PATENT DOCUMENTS
6,369,667 B1 * 4/2002 Kadota et al. ............ 333/133

FOREIGN PATENT DOCUMENTS
| JP | 5-267981 | * 10/1993 | .......... 333/195 |
| JP | 10-022764 A | 1/1998 | |
| JP | 2000-165185 A | 6/2000 | |
| JP | 2000-323956 | * 11/2000 | |

OTHER PUBLICATIONS

Kadota et al; "Very Small–Sized Resonator IF Filter Using Shear Horizontal Wave On Quartz Substrate", *2001 IEEE Ultrasonics Symposium*; Atlanta, GA, USA; Oct. 7–10; vol. 1, pp. 65–68.*

* cited by examiner

Primary Examiner—Barbara Summons
(74) Attorney, Agent, or Firm—Keating & Bennett, LLP

(57) ABSTRACT

A surface acoustic wave device includes a piezoelectric substrate, and at least one interdigital transducer disposed thereon which is made of a metal or an alloy that is heavier than Al. The acoustic velocity distribution of surface acoustic waves in the extending direction of electrode fingers of the at least one interdigital transducer is not greater than about 276 ppm, thereby effectively suppressing considerable ripples, which are noticeably found in the group delay time characteristic in particular, within the bandpass area.

20 Claims, 5 Drawing Sheets n=2, ΔV=111ppm

SURFACE ACOUSTIC WAVE DEVICE HAVING A SMALL ACOUSTIC VELOCITY DISTRIBUTION AND METHOD OF PRODUCING THE SAME

BACKGROUND OF THE INVENTION

1. Field of the Invention

The present invention generally relates to surface acoustic wave devices implemented as resonators or bandpass filters, and a method of producing the same. More particularly, the present invention relates to a surface acoustic wave device using a relatively heavy electrode material so that shear-horizontal surface waves can be utilized, and to a method of producing the same.

2. Description of the Related Art

A surface acoustic wave (SAW) device is widely used as a resonator or a bandpass filter. A typical surface acoustic wave device has a piezoelectric substrate, and electrodes of interdigital transducers (IDTs) and reflectors disposed on the piezoelectric substrate, which are made of an electrode material mainly including Al.

As known in the art, a surface acoustic wave device having electrodes made of tungsten (W) or tantalum (Ta), which is relatively heavy, could utilize shear-horizontal (SH) surface acoustic waves.

However, in such a surface acoustic device using a relatively heavy electrode material, variations in film thickness or line width are inevitable when the electrodes of IDTs and reflectors are formed. The surface acoustic wave device using a relatively heavy electrode material would cause considerable variations in the acoustic velocity distribution, or the frequency distribution, of surface acoustic waves because the electrode material is heavier than the electrode material of a typical surface acoustic wave device which mainly includes Al. As a result, significant and critical ripples are exhibited on the group delay time characteristic within a bandpass area, as indicated by an arrow A in FIG. 10.

FIG. 10 depicts the attenuation frequency characteristic versus the group delay time characteristic of a longitudinally coupled resonator SAW filter having two IDTs with a center frequency of 225 MHz. The longitudinally coupled resonator SAW filter has a piezoelectric substrate using a quartz substrate (37° rotated Y-cut plate), and IDTs and reflectors which are made of Ta.

SUMMARY OF THE INVENTION

In order to overcome the problems described above, preferred embodiments of the present invention provide a surface acoustic wave device using a relatively heavy electrode material such as Ta so that SH surface acoustic waves can be utilized, wherein the acoustic velocity distribution, or the frequency distribution, of the surface acoustic waves in the extending direction of the electrode fingers is minimized, thereby suppressing ripples within a bandpass area, and to provide a method of producing such a surface acoustic wave device.

According to a preferred embodiment of the present invention, a surface acoustic wave device includes a piezoelectric substrate, and at least one interdigital transducer having a plurality of electrode fingers extending substantially parallel to each other. The interdigital transducer is disposed on the piezoelectric substrate, and is made of a metal heavier than Al or an alloy heavier than Al. The acoustic velocity distribution of surface acoustic waves in the extending direction of the electrode fingers of the interdigital transducer is not greater than about 276 ppm.

Preferably, the surface acoustic wave device further includes a pair of reflectors each having a plurality of electrode fingers, the pair of reflectors being disposed on the piezoelectric substrate, wherein the acoustic velocity distribution of the surface waves in the extending direction of the electrode fingers of the pair of reflectors is not greater than about 276 ppm.

The at least one interdigital transducer may include first and second interdigital transducers arranged side-by-side in the propagating direction of the surface acoustic waves. The pair of reflectors are positioned at both sides of the location where the first and second interdigital transducers are positioned in the propagating direction of surface waves. The first and second interdigital transducers, and the pair of reflectors define a longitudinally coupled resonator filter.

Preferably, the surface waves are SH surface waves such as Love waves.

The acoustic velocity distribution of the surface acoustic waves in the piezoelectric substrate on which the at least one interdigital transducer is disposed may incline substantially perpendicularly to the extending direction of the electrode fingers of the at least one interdigital transducer.

Another preferred embodiment of the present invention provides a method of producing a surface acoustic wave device including a piezoelectric substrate, and at least one interdigital transducer having a plurality of electrode fingers extending substantially parallel to each other, the interdigital transducer being disposed on the piezoelectric substrate and made of a metal heavier than Al or an alloy heavier than Al, wherein the acoustic velocity distribution of surface waves in the extending direction of the electrode fingers of the interdigital transducer is not greater than about 276 ppm. The method includes the steps of preparing a wafer having a plurality of surface acoustic wave devices provided thereon, measuring the acoustic velocity distribution of the surface acoustic waves in the extending direction of the electrode fingers in each of the surface acoustic wave devices disposed on the wafer, and cutting out of the wafer the surface acoustic wave devices in which the acoustic velocity distribution of the surface waves is not greater than about 276 ppm.

In still another preferred embodiment of the present invention, there is provided a method of producing a surface acoustic wave device, the surface acoustic wave device including a piezoelectric substrate, and at least one interdigital transducer having a plurality of electrode fingers extending substantially parallel to each other, the interdigital transducer being disposed on the piezoelectric substrate and made of a metal heavier than Al or an alloy heavier than Al, wherein the acoustic velocity distribution of surface acoustic waves in the extending direction of the electrode fingers of the interdigital transducer is not greater than about 276 ppm. The method includes the steps of depositing a metal film on the piezoelectric substrate to form the interdigital transducer thereon, and patterning the metal film via photolithography. The depositing step and the patterning step are performed such that the effect of the film thickness profile in the extending direction of the electrode fingers on the acoustic velocity distribution is cancelled out by the effect of the film width profile in the extending direction of the electrode fingers on the acoustic velocity distribution.

A surface acoustic wave device according to another preferred embodiment of the present invention has a piezoelectric substrate, and at least one IDT disposed thereon which is made of a metal or an alloy that is heavier than Al. Since the acoustic velocity distribution of surface acoustic waves in the extending direction of the electrode fingers of the IDT is not greater than about 276 ppm, ripples which may be caused by the relatively heavy electrode material within a bandpass area can be effectively suppressed. Therefore, the surface acoustic wave device provides a superior frequency characteristic in which the ripples are reduced within the bandpass area.

A surface acoustic wave device having reflectors, in which the acoustic velocity distribution of the surface acoustic waves in the extending direction of the electrode fingers of the reflectors is not greater than about 276 ppm, also effectively suppresses ripples within the bandpass area.

The surface acoustic wave device according to preferred embodiments of the present invention is not limited to a longitudinally coupled resonator filter. The present invention may be applied to a variety of surface acoustic wave devices, and a longitudinally coupled resonator filter in which ripples are reduced within a bandpass area may be achieved according to preferred embodiments of the present invention.

Typically, a surface acoustic wave device which utilizes SH surface waves has electrodes made of a metal or an alloy that is heavier than Al, causing ripples due to the heavier electrode material. The present invention enables the ripples to be effectively minimized. The surface acoustic wave device that utilizes SH surface waves, such as Love waves, provides a superior frequency characteristic.

According to preferred embodiments of the present invention, the acoustic velocity distribution of the surface acoustic waves in the piezoelectric substrate on which IDTs are provided inclines substantially perpendicularly to the extending direction of the electrode fingers of the IDTs. This makes it easy to set the acoustic velocity distribution of the surface waves in the extending direction of the electrode fingers of the IDTs to be not greater than about 276 ppm.

Other features, elements, characteristics and advantages of the present invention will become more apparent from the following detailed description of the preferred embodiments with reference to the attached drawings.

DETAILED DESCRIPTION OF PREFERRED EMBODIMENTS

The present invention will be fully apparent from the following detailed description of preferred embodiments of the present invention with reference to the figures.

Figure 1:
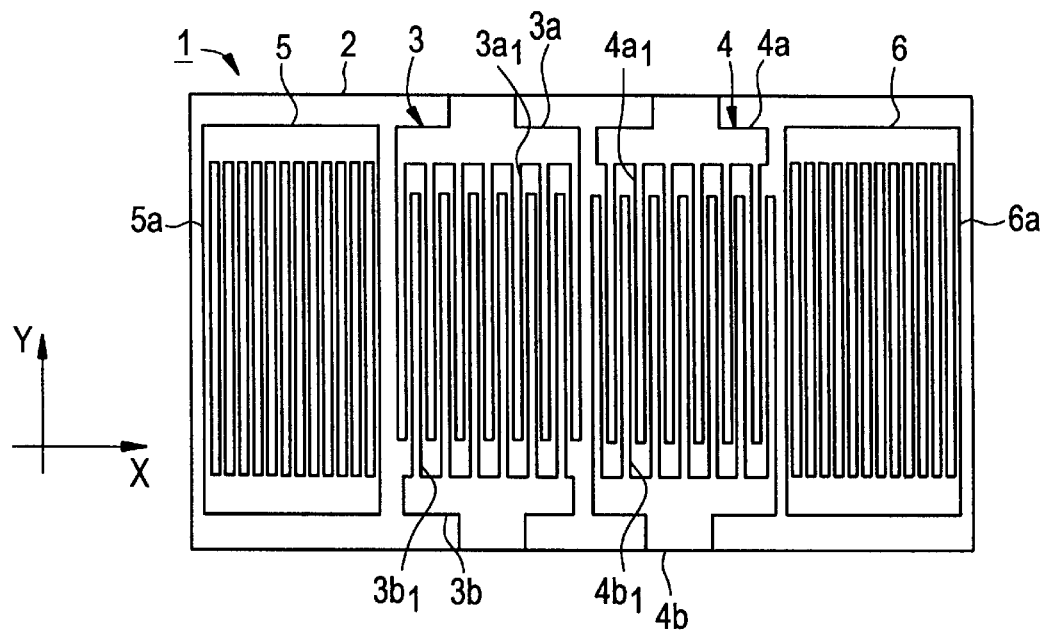
FIG. 1 is a schematic plan view of a surface acoustic wave device according to a preferred embodiment of the present invention.

FIG. 1 is a schematic plan view of a surface acoustic wave device 1 according to a preferred embodiment of the present invention. The surface acoustic wave device 1 can be a longitudinally coupled resonator SAW filter having two IDTs 3 and 4.

Referring to FIG. 1, the surface acoustic wave device 1 includes a substantially rectangular piezoelectric substrate 2. The piezoelectric substrate 2 can be a quartz substrate or other suitable substrate. The piezoelectric substrate 2 may also be formed of other single-crystal piezoelectric materials including $LiTaO_3$ (LT), or otherwise piezoelectric ceramics.

The IDTs 3 and 4 are placed on the top of the piezoelectric substrate 2. The IDT 3 includes a pair of comb-like electrodes 3a and 3b, and the IDT 4 includes a pair of comb-like electrodes 4a and 4b. The comb-like electrodes 3a, 3b, 4a, and 4b each include a plurality of electrode fingers, namely, $3a_1$, $3b_1$, $4a_1$, and $4b_1$. The plurality of electrode fingers $3a_1$, $3b_1$, $4a_1$, and $4b_1$ extend substantially parallel to each other.

In the illustrated preferred embodiment, the IDT 3 becomes an input IDT, and an output is taken from the IDT 4. As an input voltage is applied to the IDT 3, surface acoustic waves are excited, and are propagated in a direction that is perpendicular to the direction in which the electrode fingers $3a_1$, $3b_1$, $4a_1$, and $4b_1$ extend.

Reflectors 5 and 6 are provided at both sides of the location where the IDTs 3 and 4 are positioned in the propagating direction of the surface waves. The reflectors 5 and 6 can be grating reflectors, each having a plurality of electrode fingers, 5a and 6a. The plurality of electrode fingers 5a and 6a are each short-circuited at both ends thereof.

The IDTs 3 and 4, and the reflectors 5 and 6 are preferably made of Ta in the illustrated preferred embodiment. In other words, they are formed of a metal that is heavier than Al. The material of the electrodes of the IDTs 3 and 4, and the reflectors 5 and 6 are not particularly limited as long as the material is a heavier metal than Al, and may include metals such as Au, W, Mo, Ni, Cu, Co, Cr, Zn, Fe, and Mn, other than Ta, and an alloy containing thereof, which is heavier than Al, as appropriate.

Imagine X-Y coordinates for the piezoelectric substrate 2, as shown on the left side in FIG. 1, where the X direction corresponds to the propagating direction of the surface acoustic waves. Then, the Y direction corresponds to the extending direction of the electrode fingers $3a_1$, $3b_1$, $4a_1$, $4b_1$, 5a, and 6a.

In the illustrated preferred embodiment, as an input voltage is applied to the IDT 3, SH waves are excited, and an output based on the resulting SH waves is taken from the IDT 4 at the output.

In the illustrated preferred embodiment, advantageously, the acoustic velocity distribution of the SH waves in the Y direction is not greater than about 276 ppm, thereby suppressing and minimizing considerable ripples, which are noticeably found in the group delay time characteristic in particular, within the bandpass area. This reason will now be further described in detail.

As described above, the surface acoustic wave device having electrodes made of a metal that is heavier than Al can utilize SH surface waves such as Love waves. However, the heavier electrode material causes variations in film thickness or line width of the electrodes, possibly resulting in considerable ripples.

The present inventors made an intensive study on such ripples, and have finally found that an acoustic velocity distribution having a predetermined magnitude or more in the extending direction of the electrode fingers $3a_1$, $3b_1$, $4a_1$, $4b_1$, $5a$, and $6a$ of the IDTs 3 and 4, and the reflectors 5 and 6 causes considerable ripples. That is, in the case where a thickness of an IDT or width of electrode fingers of the IDT deviate in the direction along which the electrode fingers extend, an acoustic velocity also is distributed or deviates in the direction along which the electrode fingers extend.

In view of a relational expression of (acoustic velocity)=(wavelength)×(frequency), when the wavelength is constant, the amount of variations in acoustic velocity would be fully equivalent to the amount of variations in frequency. That is, the following relational expression is obtained:

(acoustic velocity distribution)=(frequency distribution).

In the following description, a longitudinally coupled resonator SAW filter having a receiving frequency of 225 MHz is specifically considered.

Figure 2:
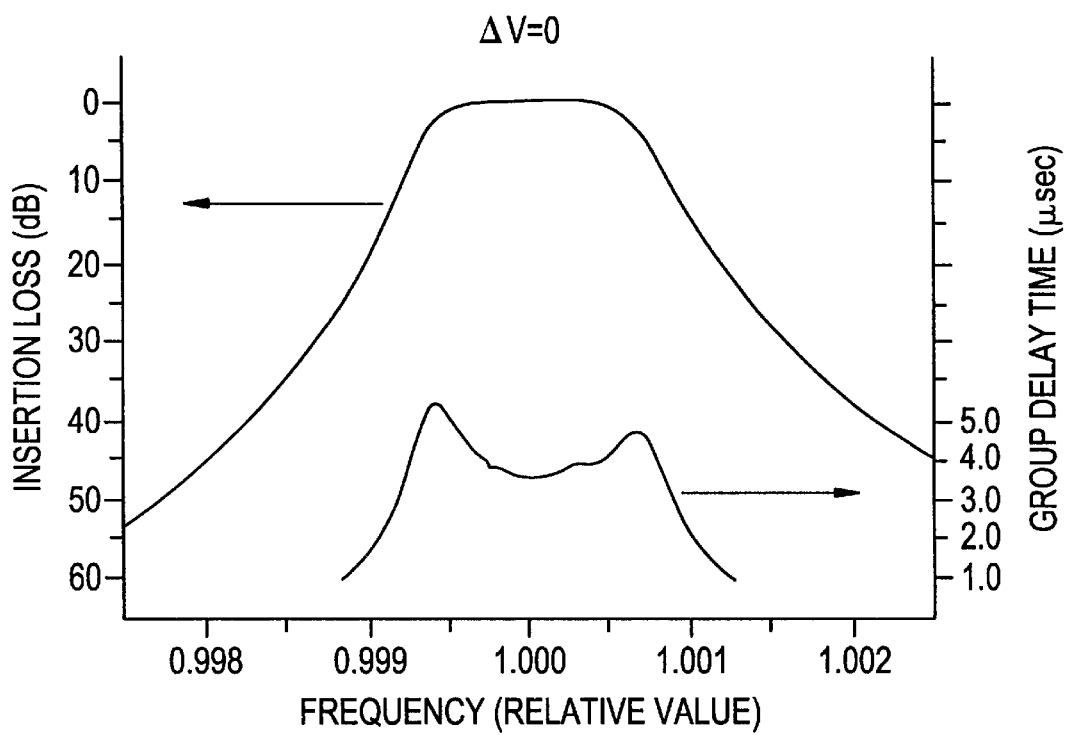
FIG. 2 is a graph showing a frequency characteristic of the surface acoustic wave device shown in FIG. 1, provided that there is no acoustic velocity distribution of surface waves in the extending direction of electrode fingers of IDTs and reflectors.

Characteristics in the case where the acoustic velocity of the surface waves is uniform in the extending direction of the electrode fingers were simulated using an equivalent circuit method. FIG. 2 illustrates the result thereof, showing the attenuation frequency characteristic versus the group delay time characteristic.

As is apparent from FIG. 2, the group delay time characteristic is highly smooth within the bandpass area, and ripples are not significantly exhibited.

Now, based on the simulation result, a review was made of a change in those characteristics when the acoustic velocity distribution of the surface waves occurs in the extending direction of the electrode fingers $3a_1$, $3b_1$, $4a_1$, $4b_1$, $5a$, and $6a$, namely, across the width direction of the substrate. It is noted that the tolerance of ripples in the group delay time characteristic is defined such that about 10% of the deviation of the group delay time within the bandpass area, i.e., the maximum group delay time value minus the minimum group delay time value, is rendered as the upper limit, which is required to provide a surface acoustic wave device having superior performance.

Figure 3:
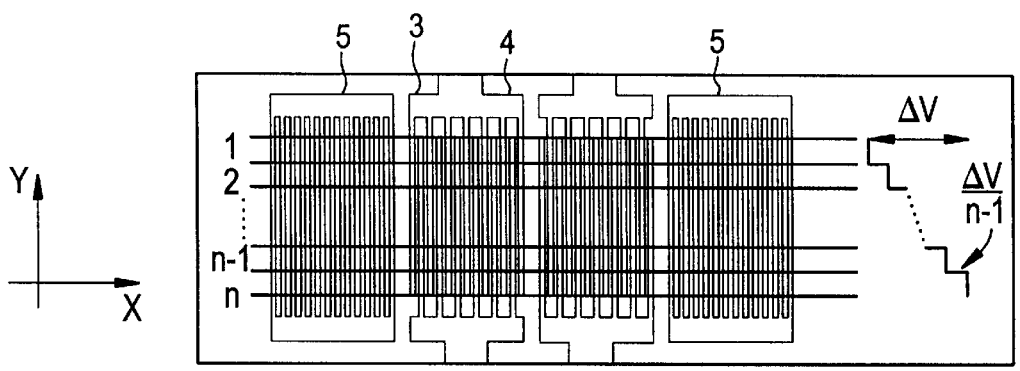
FIG. 3 is a schematic plan view of the surface acoustic wave device that supports calculation models shown in FIGS. 4 to 7.

An illustration is shown in FIG. 3, in which the surface acoustic wave device 1 is divided into n regions in the extending direction of the electrode fingers $3a_1$, $3b_1$, $4a_1$, $4b_1$, $5a$, and $6a$ (in the Y direction), and the acoustic velocity distribution is profiled to have a stepped configuration as indicated on the right side in FIG. 3. In the acoustic velocity distribution depicted on the right side of FIG. 3, the magnitude of the acoustic velocity of the surface waves across the width direction of the substrate, or in the extending direction of the electrode fingers $3a_1$, $3b_1$, $4a_1$, $4b_1$, $5a$, and $6a$ is represented by an acoustic velocity V. A symbol ΔV represents the sum of differences between the acoustic velocities of the adjacent regions.

In FIG. 3, the group delay time characteristic was estimated by a simulation in which the acoustic velocity difference ΔV, which may be a difference between the acoustic velocity in a region having the maximum acoustic velocity and the acoustic velocity in a region having the minimum acoustic velocity, greatly increases stepwise from zero.

Figure 4:
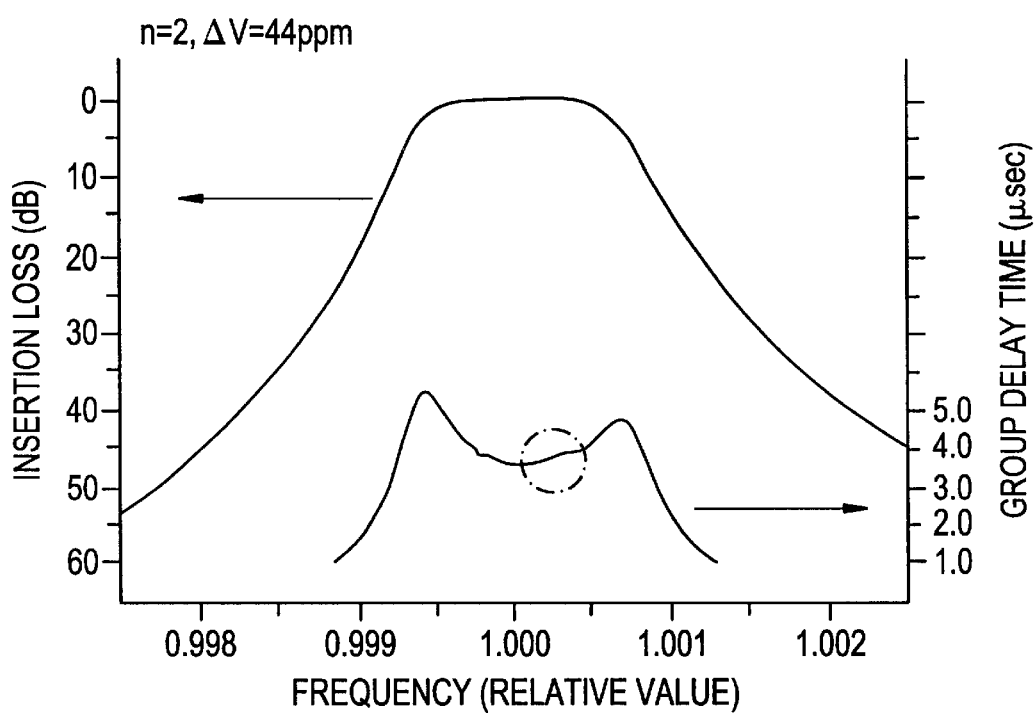
FIG. 4 is a graph showing the frequency characteristic of the surface acoustic wave device where n=2 and $\Delta V$=44 ppm.
Figure 5:
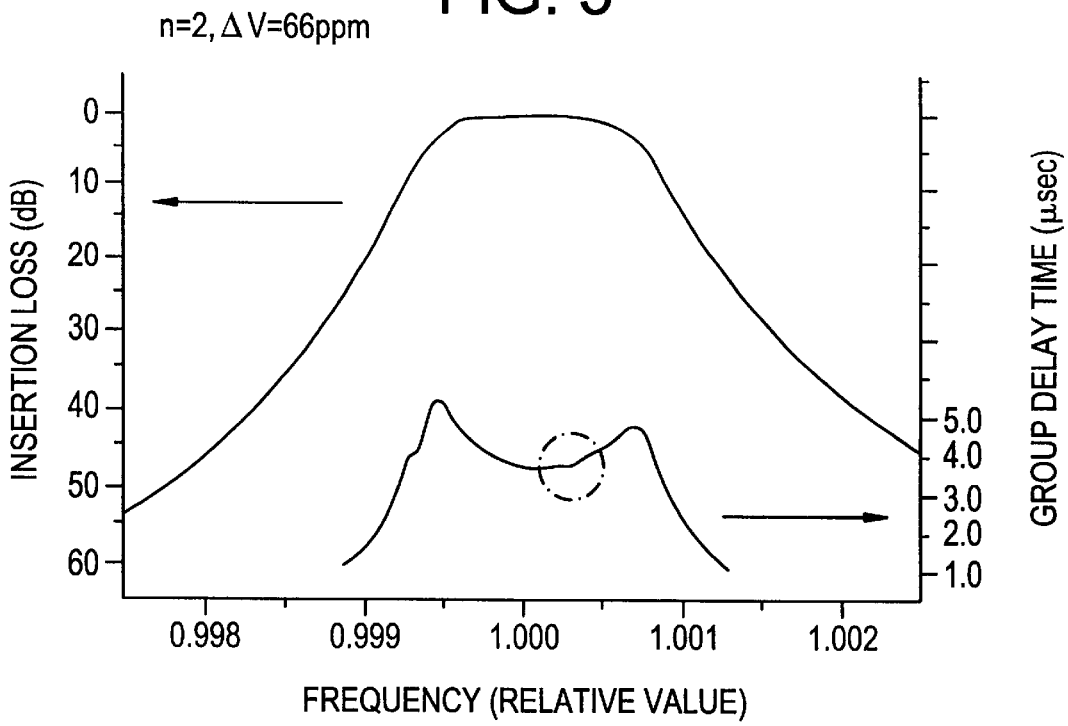
FIG. 5 is a graph showing the frequency characteristic of the surface acoustic wave device where n=2 and $\Delta V$=66 ppm.
Figure 6:
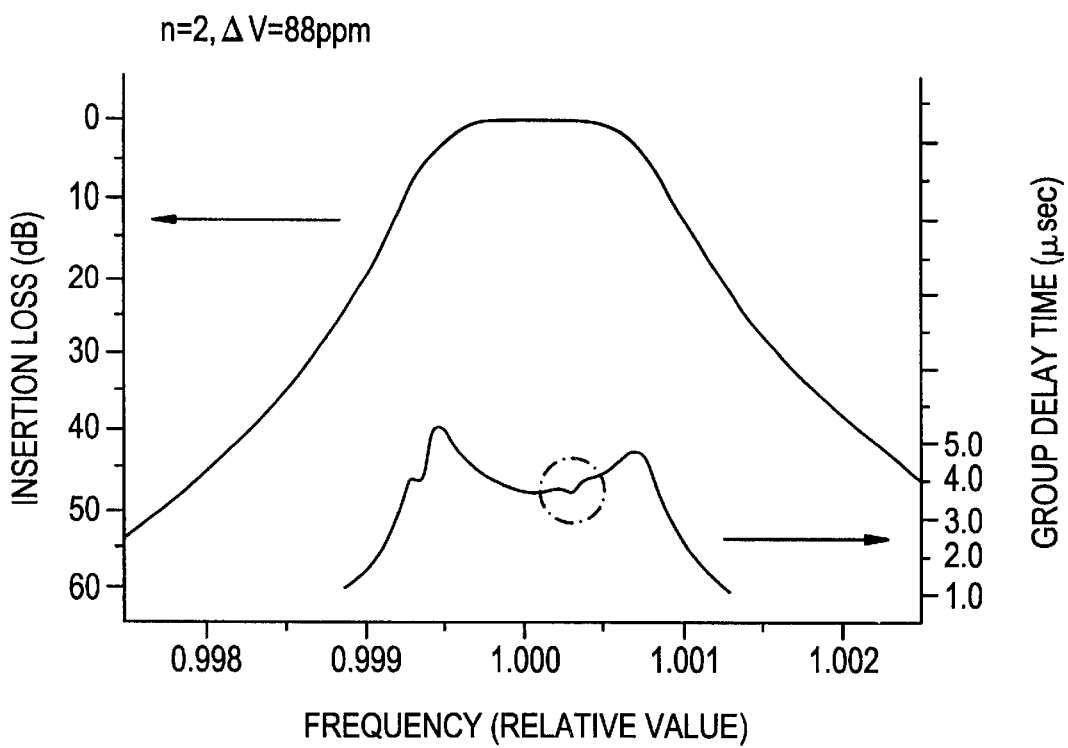
FIG. 6 is a graph showing the frequency characteristic of the surface acoustic wave device where n=2 and $\Delta V$=88 ppm.
Figure 7:
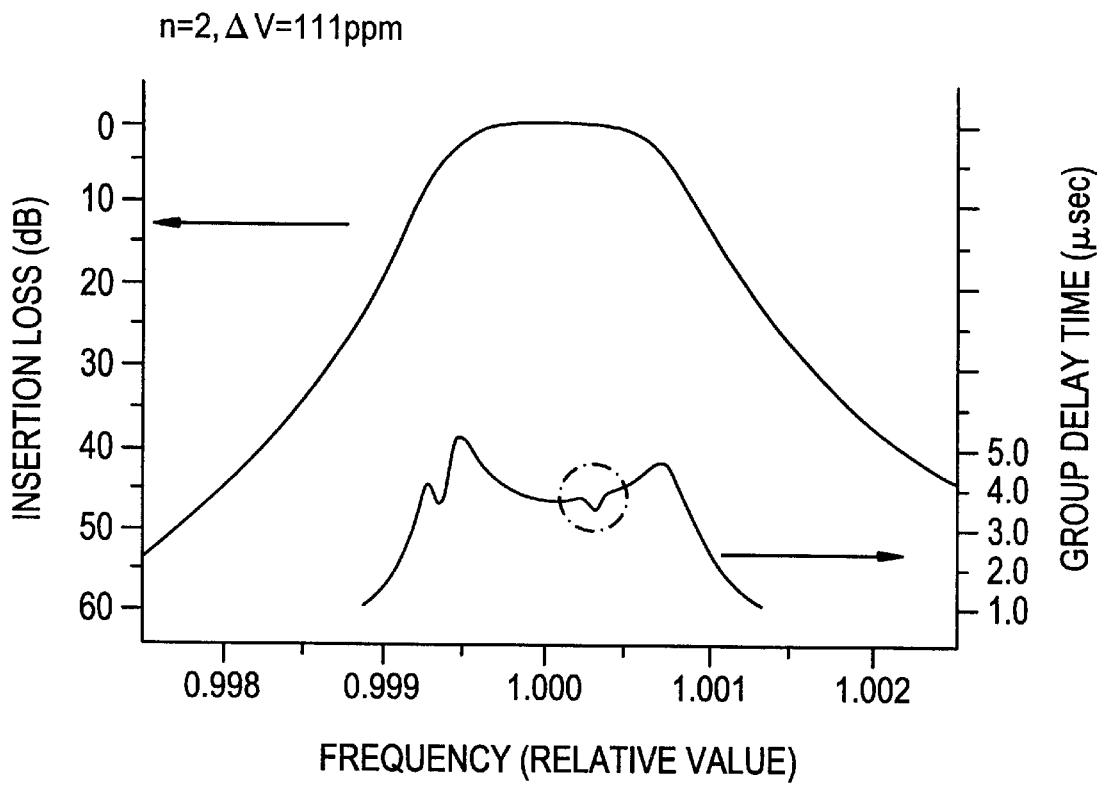
FIG. 7 is a graph showing the frequency characteristic of the surface acoustic wave device where n=2 and $\Delta V$=111 ppm.

The following results were obtained where n=2, as shown in FIGS. 4 to 7: ΔV=44 ppm (10 kHz with respect to 225 MHz) in FIG. 4, ΔV=66 ppm (15 kHz with respect to 225 MHz) in FIG. 5, ΔV=88 ppm (20 kHz with respect to 225 MHz) in FIG. 6, and ΔV=111 ppm (25 kHz with respect to 225 MHz) in FIG. 7.

It is understood from FIGS. 4 to 7 that as the acoustic velocity distribution, or the acoustic velocity difference ΔV, increases, greater ripples are exhibited on the group delay time characteristic within the bandpass area.

As is further understood that, where n=2, or if the region in which the surface waves are propagated is divided into two in the extending direction of the electrode fingers, the maximum value of the acoustic velocity difference ΔV is approximately 88 ppm (20 kHz) where the magnitude of the ripples exhibited on the group delay time characteristic is about 10% of the deviation, as previously described.

The maximum acoustic velocity difference ΔV in which the magnitude of the ripples exhibited on the group delay time characteristic is within approximately 10% of the deviation was calculated in the same way where n=3, 5, 10, and 15. The results are shown in FIG. 8.

Figure 8:
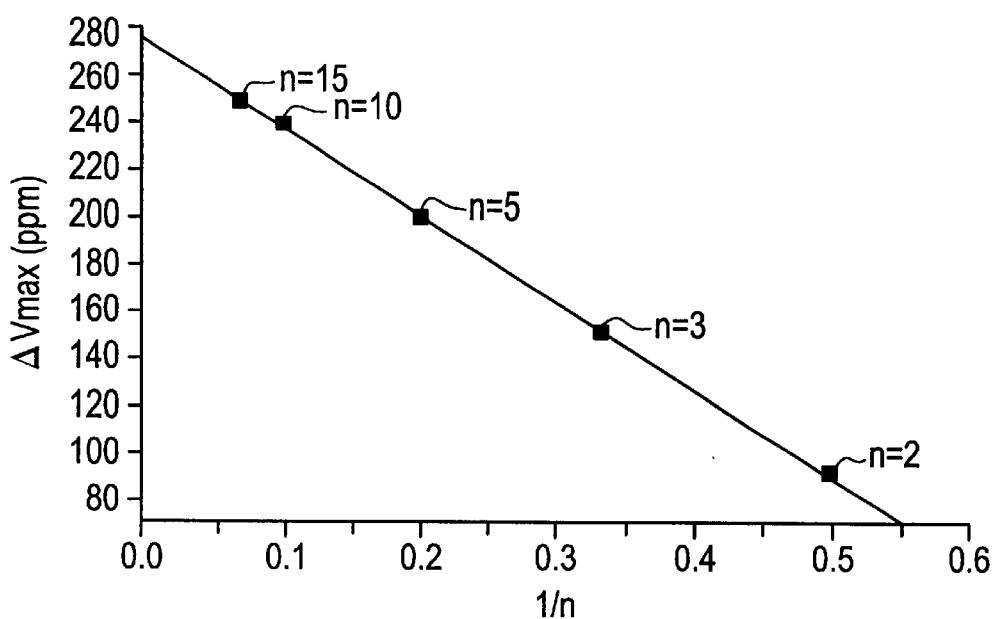
FIG. 8 is a graph showing a relationship between 1/n and a maximum acoustic velocity difference $\Delta V$max when ripples are tolerable.

In FIG. 8, the abscissa indicates the inverse of the number n of divided regions, and the ordinate indicates the maximum value ΔVmax of the acoustic velocity difference ΔV when the ripples are tolerable.

As is apparent from FIG. 8, the maximum acoustic velocity difference ΔVmax when the magnitude of the ripples is within approximately 10% of the deviation is inversely proportional to the inverse of n.

As is also apparent from FIG. 8, when an extrapolation is performed provided that n=infinity, the maximum acoustic velocity difference ΔVmax is about 276 ppm.

Accordingly, as is anticipated from the results shown in FIG. 8, when the acoustic velocity distribution of the surface waves in the extending direction of the electrode fingers $3a_1$, $3b_1$, $4a_1$, $4b_1$, $5a$, and $6a$ of the IDTs 3 and 4, and the reflectors 5 and 6 is not greater than about 276 ppm, considerable ripples exhibited on the group delay time characteristic within the bandpass area can be effectively suppressed. As a result of the inventors' experiments, the inventors confirmed that the acoustic velocity distribution of about 276 ppm is caused by an IDT thickness distribution of about 0.5 nm in the IDT that is made of Ta or W. Therefore, it is preferable that the thickness distribution of the IDT is within about 0.5 nm in the direction along which the electrode fingers of the IDT extend.

In the illustrated preferred embodiment, the IDTs 3 and 4, and the reflectors 5 and 6 are arranged in a matrix on the mother piezoelectric substrate 2, and the frequency distribution in the mother piezoelectric substrate 2 is then measured. Based on the above-noted results, the surface acoustic wave device in which the acoustic velocity distribution of the surface waves in the extending direction of the electrode fingers is not greater than about 276 ppm is extracted, and the characteristics thereof are determined. The result thereof is shown in FIG. 9.

Figure 9:
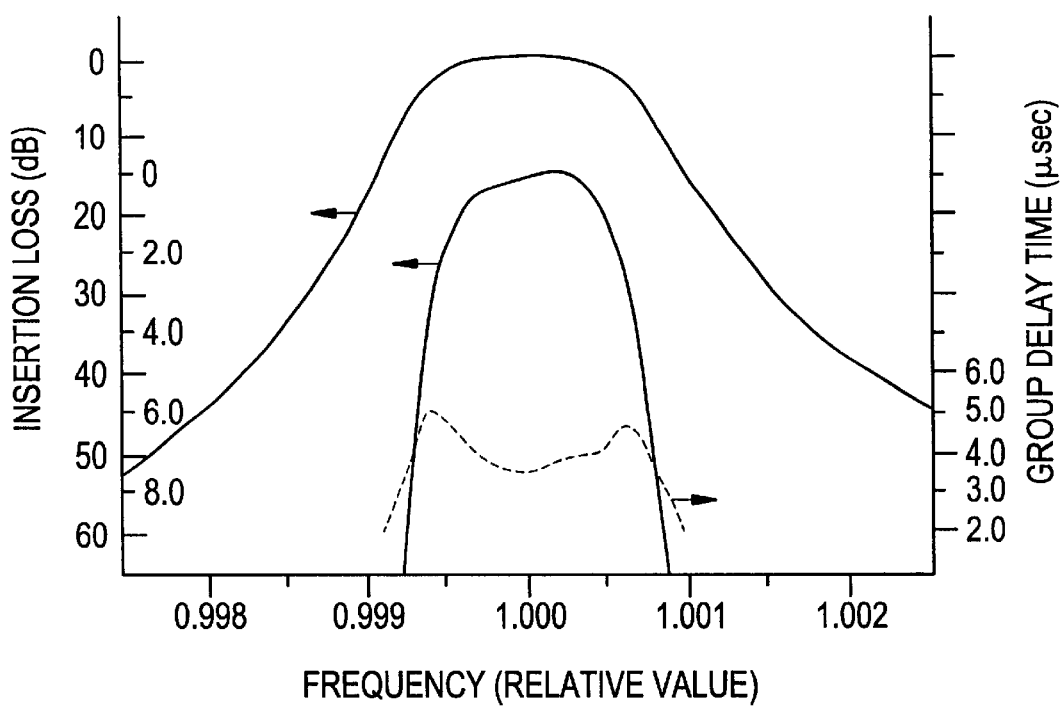
FIG. 9 is a graph showing a frequency characteristic of the surface acoustic wave device according to a preferred embodiment of the present invention.
Figure 10:
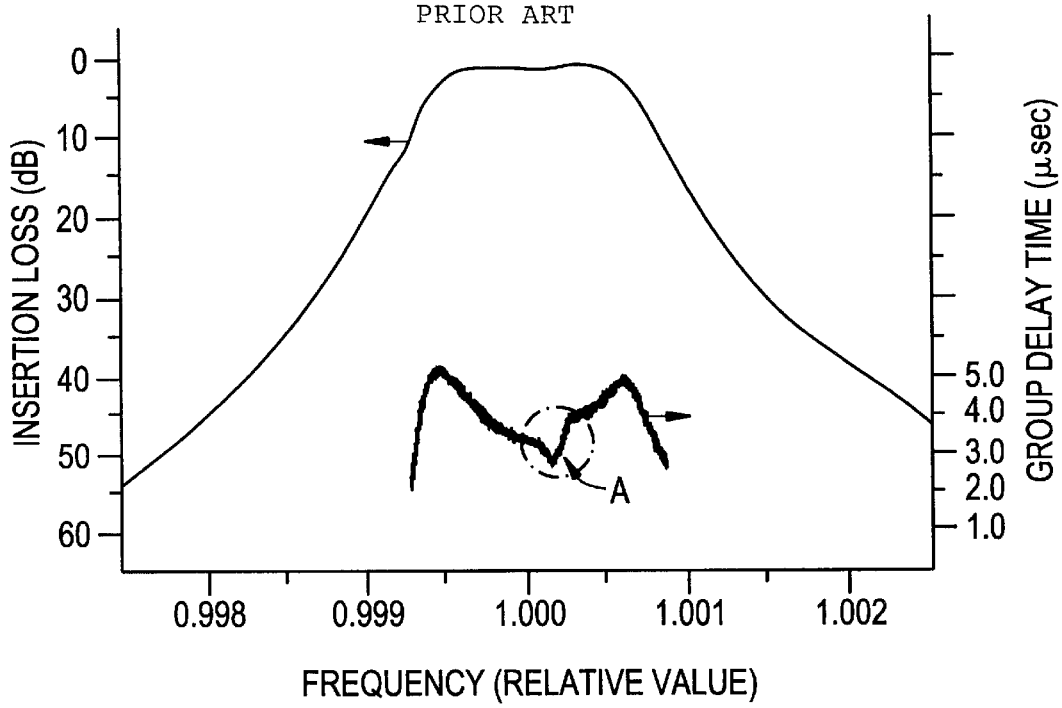
FIG. 10 is a graph showing a frequency characteristic of a conventional surface acoustic wave device.

Apparently from FIG. 9, the resulting surface acoustic wave device 1 does not exhibit any significant or considerable ripples on the group delay time characteristic within the bandpass area.

In this example, the acoustic velocity distribution of the surface waves on the mother piezoelectric substrate 2 in the extending direction of the electrode fingers $3a_1$, $3b_1$, $4a_1$, $4b_1$, $5a$, and $6a$ was obtained by performing the frequency measurement by probing.

Specifically, an approach was taken which includes forming a number of surface acoustic wave devices on a mother piezoelectric substrate, measuring the acoustic velocity distribution of surface waves in each of the surface acoustic wave devices in the extending direction of the electrode fingers, and then cutting out of a wafer the surface acoustic wave device in which the acoustic velocity distribution of the surface waves is not greater than about 276 ppm. This approach may be replaced such that the acoustic velocity distribution of the surface waves is reduced over the entire mother piezoelectric substrate. This can be achieved, for example, by using a thin film forming apparatus that can form a thin film having a very small thickness distribution over a wafer or etching apparatus that can etch a thin film with a very small distribution in etching properties.

Alternatively, an IDT may be patterned on a piezoelectric substrate having a thin film for forming an IDT such that a maximum thickness distribution direction of the thin film is substantially perpendicular to the direction along which electrode fingers of the IDT extend. This arrangement of the IDT with respect to the thin film makes the thickness distribution of the IDT in the direction along which electrode fingers of the IDT extend relatively small.

Otherwise, in a method of producing a surface acoustic wave device which includes depositing a metal film on a piezoelectric substrate to form an IDT, and patterning the resulting film by photolithography, the depositing step and the patterning step may be performed such that the effect of the film thickness profile in the extending direction of the electrode fingers on the acoustic velocity distribution is cancelled out by the effect of the film width profile in the extending direction of the electrode fingers on the acoustic velocity distribution.

Although a longitudinally coupled resonator filter having two IDTs has been described in the illustrated preferred embodiment, the present invention is not limited thereto, and may be applied to a variety of devices including transversely coupled resonator filters, surface acoustic wave resonators having a single IDT, and various surface acoustic wave filters having a plurality of IDTs such as ladder filters and lattice filters.

In addition to SH surface waves, other SH surface waves may also be utilized. Furthermore, the present invention may be applied to surface acoustic wave devices that utilize surface waves other than SH surface waves.

While the present invention has been particularly shown and described with reference to preferred embodiments thereof, it will be understood by those skilled in the art that the foregoing and other changes in form and details can be made without departing from the spirit and scope of the invention.

What is claimed is:

1. A surface acoustic wave device comprising:
    a piezoelectric substrate; and
    at least one interdigital transducer having a plurality of electrode fingers extending substantially parallel to each other, said at least one interdigital transducer being disposed on said piezoelectric substrate and made of a metal heavier than Al or an alloy heavier than Al;
    wherein the acoustic velocity distribution of surface acoustic waves in the extending direction of the electrode fingers of said at least one interdigital transducer is not greater than about 276 ppm.

2. A surface acoustic wave device according to claim 1, further comprising a pair of reflectors each having a plurality of electrode fingers, said pair of reflectors being disposed on said piezoelectric substrate, wherein the acoustic velocity distribution of the surface acoustic waves in the extending direction of the electrode fingers of said pair of reflectors is not greater than about 276 ppm.

3. A surface acoustic wave device according to claim 2, wherein said at least one interdigital transducer includes first and second interdigital transducers arranged side-by-side in the propagating direction of the surface acoustic waves, and said pair of reflectors are positioned at both sides of the location where the first and second interdigital transducers are positioned in the propagating direction of surface acoustic waves, whereby the first and second interdigital transducers and said pair of reflectors are arranged to define a longitudinally coupled resonator filter.

4. A surface acoustic wave device according to claim 1, wherein the surface acoustic waves comprise SH surface waves.

5. A surface acoustic wave device according to claim 1, wherein the acoustic velocity distribution of the surface acoustic waves on the piezoelectric substrate on which said at least one interdigital transducer is provided increases substantially perpendicularly to the extending direction of the electrode fingers of said at least one interdigital transducer.

6. A surface acoustic wave device according to claim 1, wherein the piezoelectric substrate is made of one of quartz, a single-crystal piezoelectric material, and piezoelectric ceramic material.

7. A surface acoustic wave device according to claim 1, further comprising:
    at least one reflector; and
    wherein the at least one interdigital transducer and the at least one reflector are made of Ta.

8. A surface acoustic wave device according to claim 1, further comprising:
    at least one reflector; and
    wherein the at least one interdigital transducer and the at least one reflector are made of one of Au, W, Mo, Ni, Cu, Co, Cr, Zn, Fe, and Mn.

9. A method of manufacturing a surface acoustic wave device, said surface acoustic wave device including a piezoelectric substrate, and at least one interdigital transducer having a plurality of electrode fingers extending substantially parallel to each other, the interdigital transducer being formed on the piezoelectric substrate and made of a metal heavier than Al or an alloy heavier than Al, wherein the acoustic velocity distribution of surface acoustic waves in the extending direction of the electrode fingers of the interdigital transducer is not greater than about 276 ppm, said method comprising the steps of:
    preparing a wafer having a plurality of surface acoustic wave devices formed thereon;
    measuring the acoustic velocity distribution of the surface acoustic waves in the extending direction of the electrode fingers in each of the surface acoustic wave devices formed on the wafer; and
    cutting out of the wafer a surface acoustic wave device in which the acoustic velocity distribution of the surface waves is not greater than about 276 ppm.

10. The method according to claim 9, further comprising the step of forming a pair of reflectors on each of the plurality of surface acoustic wave devices, each of the pair of reflectors having a plurality of electrode fingers, wherein the acoustic velocity distribution of the surface acoustic waves in the extending direction of the electrode fingers of said pair of reflectors is not greater than about 276 ppm.

11. The method according to claim 10, wherein each of the plurality of surface acoustic wave devices includes first and second interdigital transducers arranged side-by-side in the propagating direction of the surface acoustic waves, and said pair of reflectors are positioned at both sides of the location where the first and second interdigital transducers are positioned in the propagating direction of surface acoustic waves, whereby the first and second interdigital transducers and said pair of reflectors are arranged to define a longitudinally coupled resonator filter.

12. The method according to claim 9, wherein the surface acoustic waves comprise SH surface waves.

13. The method according to claim 9, wherein the acoustic velocity distribution of the surface acoustic waves on the piezoelectric substrate on which said at least one interdigital transducer is provided increases substantially perpendicularly to the extending direction of the electrode fingers of said at least one interdigital transducer.

14. A method of producing a surface acoustic wave device, said surface acoustic wave device including a piezoelectric substrate, and at least one interdigital transducer having a plurality of electrode fingers extending substantially parallel to each other, the interdigital transducer being formed on the piezoelectric substrate and made of a metal heavier than Al or an alloy heavier than Al, wherein the acoustic velocity distribution of surface acoustic waves in the extending direction of the electrode fingers of the interdigital transducer is not greater than about 276 ppm, said method comprising the steps of:

depositing a metal film on the piezoelectric substrate to form the interdigital transducer; and patterning the metal film via photolithography, wherein the depositing step and the patterning step are performed such that the effect of the film thickness profile in the extending direction of the electrode fingers on the acoustic velocity distribution is cancelled out by the effect of the film width profile in the extending direction of the electrode fingers on the acoustic velocity distribution.

15. The method according to claim 14, wherein the metal deposited in the step of depositing is Ta.

16. The method according to claim 14, wherein the metal deposited in the step of depositing is one of Au, W, Mo, Ni, Cu, Co, Cr, Zn, Fe, and Mn.

17. The method according to claim 14, further comprising the step of forming a pair of reflectors on the surface acoustic wave device, each of the pair of reflectors having a plurality of electrode fingers, wherein the acoustic velocity distribution of the surface acoustic waves in the extending direction of the electrode fingers of said pair of reflectors is not greater than about 276 ppm.

18. The method according to claim 14, wherein the surface acoustic wave device includes first and second interdigital transducers arranged side-by-side in the propagating direction of the surface acoustic waves, and a pair of reflectors are positioned at both sides of the location where the first and second interdigital transducers are positioned in the propagating direction of surface acoustic waves, whereby the first and second interdigital transducers and said pair of reflectors are arranged to define a longitudinally coupled resonator filter.

19. The method according to claim 14, wherein the surface acoustic waves comprise SH surface waves.

20. The method according to claim 14, wherein the acoustic velocity distribution of the surface acoustic waves on the piezoelectric substrate on which said at least one interdigital transducer is provided increases substantially perpendicularly to the extending direction of the electrode fingers of said at least one interdigital transducer.

* * * * *